(12) United States Patent
Ng et al.

(10) Patent No.: US 7,098,816 B2
(45) Date of Patent: Aug. 29, 2006

(54) TRI-STATE DELTA CODEC METHOD AND SYSTEM

(75) Inventors: Yu Chau Ng, Hong Kong (CN); Cheuk Wai Mok, Hong Kong (CN)

(73) Assignee: Rich-Tech HK Limited, Hong Kong (CN)

( * ) Notice: Subject to any disclaimer, the term of this patent is extended or adjusted under 35 U.S.C. 154(b) by 0 days.

(21) Appl. No.: 10/908,687

(22) Filed: May 23, 2005

(65) Prior Publication Data

US 2005/0275574 A1    Dec. 15, 2005

Related U.S. Application Data

(60) Provisional application No. 60/575,780, filed on Jun. 1, 2004.

(51) Int. Cl.
*H03M 5/16* (2006.01)

(52) U.S. Cl. ...................................................... 341/57

(58) Field of Classification Search ............ 326/56–58, 326/82–83, 89, 112, 115, 26–27; 341/56, 341/57, 50
See application file for complete search history.

(56) References Cited

U.S. PATENT DOCUMENTS

| | | | |
|---|---|---|---|
| 3,643,180 A | 2/1972 | Shimamura et al. | |
| 4,199,722 A * | 4/1980 | Paz | ............................. 375/246 |
| 4,646,322 A | 2/1987 | Flanagin et al. | |
| 5,222,077 A * | 6/1993 | Krishnan | ..................... 375/261 |
| 5,283,646 A | 2/1994 | Bruder | |
| 6,128,346 A | 10/2000 | Suarez et al. | |

OTHER PUBLICATIONS

N. S. Jayant, et al., "Digital Coding of Waveforms", Prentice-Hall, Inc., Englewood Cliffs, New Jercey 07632, no month.
James L. Flanacan, et al., "Speech Coding", IEEE Transactions on Communications, vol. COM-27, No. 4, Apr. 1979.

* cited by examiner

*Primary Examiner*—Brian Young
(74) *Attorney, Agent, or Firm*—3Law Techlaw Services; Zeming M. Gao

(57) ABSTRACT

A delta modulation method and system is provided for processing signals in a digital communications system. The method quantizes an input signal using a tri-state quantizer into a quantized value selected from a set of three different quantized values including a low value, a middle value, and a high value. The selection of the quantized value is based on a comparison between the input signal and a predicted signal of a corresponding sampling period. The method generates from the quantized value an output signal representative of the input signal, determines a predicted signal of the next sampling period, and then feeds the predicted signal of next sampling period back to the tri-state quantizer.

19 Claims, 11 Drawing Sheets

TRI-STATE DELTA CODEC METHOD AND SYSTEM

CROSS-REFERENCE TO RELATED APPLICATIONS

This application claims benefit under 35 U.S.C. § 119(e) of Provisional Application 60/575,780, filed Jun. 1, 2004, entitled "Radix-3 Codec".

BACKGROUND

1. Field of the Invention

The present invention relates generally to the field of signal processing involving signal conversion, modulation, encoding, decoding, and/or compression, and more particularly to delta modulation methods for converting and modulating an analog signal to a digital signal.

2. Description of the Prior Art

Delta modulation (DM) is an analog-to-digital signal conversion in which the analog signal is approximated with a series of segments, and each segment of the approximated signal is then compared with the original analog wave to determine the increase or decrease in relative amplitude. The decision process for establishing the state of successive bits is determined by this comparison, and only the change of information is retained, stored or sent. Specifically, conventional delta modulation describes a status of the signal in a quantized binary fashion. The status is either "1" or "0", representing either an increase or decrease of the present status of the signal when compared to the previous status of the signal. Only an increase or decrease of the signal amplitude from the previous sample is retained. An output signal is then reconstructed (decoded) through integration (summing up) of the consecutive statuses of the signal to represent the origin of signal. The ingenuity of delta modulation technique lies in its taking advantage of the inherent data redundancy to greatly reduce the amount of data without losing much information. For this reason, delta modulation is also referred to as delta compression. Since its inception in the early 1950s, delta modulation technique has proven to be a highly advantageous signal modulation method when compared to other pulse communications systems. It is now often the de facto method used in a broader range of applications of signal processing, compression, transmitting, and data streaming. Although its most common use is for processing audio signals, delta modulation technique is not limited to such signals. In principle, delta modulation technique can be applied to any type of signal that can be digitized, including but not limited to audio signals, image signals and video signals.

Delta modulation used in communications systems usually has a differential input circuit having one input connected to a source of input signals (typically analog signals) to be encoded, and a second input to receive a feedback signal. The system also has a decoder connected to a decision circuit. The output of the decision circuit acts as the output of the delta modulation, but is additionally applied to the second input of the differential input circuit as the feedback signal to facilitate a comparison operation.

In general, the performance of a delta modulation apparatus is affected by sampling rate and choices of quantization steps. Delta modulation typically exhibits a maximum tracing slope for an input signal to be encoded. The tracing slope is limited by the product of the magnitude of the quantization step of the decision circuit and the frequency of the sampling pulses applied. For a given sampling rate (the frequency of the sampling pulses), a steeper slope of the signal (corresponding to either rapid increase or decrease of the signal amplitude) requires a greater quantization step. On the other hand, a large quantization step may produce high-level noises when applied in relatively smoother regions of the signal. To reduce this problem, adaptive delta modulation techniques, such as Continuous Variable Step Delta Modulation (CVSD), are used. These techniques use dynamically adaptive quantization steps to suit for signals having both steep slopes and smoother regions.

Despite the advancements in the delta modulation technique, further improvement is desired. One area for improvement is signal/noise ratio. For applications involving data compression, which is one of the areas where delta modulation is particularly useful, there is a constant demand for higher signal/noise ratio at a given sampling rate, or for maintaining the same signal/noise ratio at a lower sampling rate. This is because sampling rate is directly proportional to the size of data that needs to be stored or transmitted in a communications system. For narrowband implementations, for example, bandwidth is typically limited to 50 kHz or below, often in the range of 12.5 kHz–25 kHz, due to the limited transmission capacity of the system. A bandwidth of 12.5 kHz–25 kHz would mean that data rate is limited to 8 kbps–16 kbps or lower. These implementations include wireless voice communications systems such as wireless networks and walkie-talkie devices, and digital telephone systems. There is a significant need for improving performance at relatively low data rate for this type of narrowband implementations.

SUMMARY OF THE INVENTION

The present invention provides an improved delta modulation codec method and system for signal processing, modulation and/or compression. The method uses a unique tri-state (tertiary) quantizer, instead of the conventional dual-state (binary) quantizer, for quantizing a signal in a digital signal processing system. In one embodiment, the method starts with receiving an input signal, comparing the input signal and a current predicted signal of a corresponding sampling period using a comparison unit, and quantizing the input signal using a tri-state quantizer into a current quantized value selected from a set of three different quantized values including a low value, a middle value, and a high value, the selection of the value being based on a result of comparing the input signal and the current predicted signal. The method further generates from the quantized value an output signal representative of the input signal, determines a next predicted signal for a subsequent sampling period, and feeds the next predicted signal back to the comparison unit.

In another embodiment, the present invention is an improvement in the conventional delta modulation method, which is adapted to receive an input signal to be encoded and produce in response thereto an encoded output signal representative of the input signal received. The delta modulation includes deriving a deviation value based on a comparison between the input signal and a predicted signal of a corresponding sampling period, and quantizing the input signal using delta quantization according to the deviation value. The improvement is using a novel tri-state (tertiary) quantizer instead of a conventional dual-state (binary) quantizer.

In one embodiment, the deviation value is computed by a subtractor subtracting between the predicted signal and the input signal. The quantized value is selected to be: (a) the low value of the three different quantized values when the deviation value is below a minimum threshold; (b) the middle value of the three different quantized values when the deviation value is greater or equal to the minimum threshold but smaller or equal to a maximum threshold; or (c) the high value of the three different quantized values when the deviation value is greater than the maximum threshold.

The method may be used in combination with adaptive delta modulation techniques, such as CVSD. For example, the method may dynamically adjust a quantization step size, which is defined by a difference between the maximum threshold and the minimum threshold, using a step-size controller. The adjustment may be based on a quantization history including the current quantized value. In one embodiment, the quantization history comprises only the current quantized value. In other embodiments, however, the quantization history may include, in addition to the current quantized value, one or more past quantized values of previous sampling periods.

In embodiments that use dynamic adaptive delta modulation, the quantization step size may be adjusted by an amount measured by a delta step, and the delta step is further dynamically adjusted using the step-size controller. The adjustment of the delta step may also be based on the quantization history.

In some embodiments, the delta modulation method builds an initial next predicted signal for the subsequent sampling period using the current predicted signal, the current quantized value and a current step size, compares the initial next predicted signal with the input signal to generate a first comparison result, and compares the current predicted signal with the input signal to generate a second comparison result. Based on the first comparison result and the second comparison result, the method selects between the initial next predicted signal and the current predicted signal as the final next predicted signal. For example, the first comparison result may be a first difference value computed from a subtraction between the initial next predicted signal and the input signal, while the second comparison result may be a second difference value computed from a subtraction between the current predicted signal and the input signal. The final next predicted signal is selected to be initial next predicted signal if the first difference value is smaller than the second difference value, whereas the final next predicted signal is selected to be the current predicted signal if the first difference value is greater than or equal to the second difference value.

In some embodiments, a mapping function is used for mapping the quantized value into a mapped value, which may conveniently be a radix-3 value.

Although not limited to such, the tri-state delta modulation method in accordance with the present invention is preferably used for processing an analog signal. The analog signal is sampled at a sampling frequency rate to generate digitized pulse signals, which are then input to the codec system as the input signal.

In some embodiments, the method delays the input signal by a sampling period before the input signal is quantized, and also delays the predicted signal by a sampling period before feeding the predicted signal back to the comparison unit.

The tri-state delta modulation method can be used in a delta codec system for digital communication. The delta codec system may include a signal input stage adapted for receiving an input signal, a signal comparison stage adapted for comparing the input signal and a predicted signal of a corresponding sampling period, and a tri-state quantizer adapted for quantizing the input signal using a tri-state quantizer into a quantized value selected from a set of three different quantized values. The delta codec system further includes an encoding stage and a feedback stage. The encoding stage is for generating from the quantized value an output signal representative of the input signal and determining a predicted signal of the next sampling period. The feedback stage is for feeding the predicted signal of the next sampling period back to the tri-state quantizer.

In some embodiments, the delta codec system in accordance with the present invention further includes a look ahead processor adapted for assisting the encoding stage to determine the predicted signal of the next sampling period. In some embodiments, the delta codec system uses the step-size controller for dynamically adjusting a quantization step size. The delta codec system may also include a logic circuit for determining coincidence based on a quantization history.

The use of the tri-state quantizer in the present invention results in a significant advantage over the conventional delta modulation methods using a dual-state quantizer. At a given sampling frequency rate, particularly in narrowband (e.g., 12.5 kHz–25 kHz), the delta modulation method using the tri-state quantizer has demonstrated substantially higher signal to noise ratio. The tri-state coding mechanism of the present inventions also has an advantage of being insensitive to transmission random bit error. Furthermore, the introduction of a middle state (e.g., zero state) results in an output bitstream that spans less frequency spectrum because the middle state acts as a transitional state are holding state when bit pattern changes from +1 to −1, and thus reduces the power of high-frequency component of the frequency spectrum of the bitstream.

Other features and advantages of the disclosure will become more readily understandable from the following detailed description and figures, in which the inventions have been described below with reference to specific embodiments.

BRIEF DESCRIPTION OF THE FIGURES

The tri-state delta modulation method and system will be described in detail along with the following figures, in which like parts are denoted with like reference numerals or letters.

DETAILED DESCRIPTION OF THE INVENTION

The present inventions provide systems and methods for signal processing using delta modulation. Those skilled in the art will recognize that various features disclosed in connection with the embodiments may be used either individually or jointly. It is to be appreciated that while the present inventions have been described with reference to preferred implementations, those having ordinary skill in the art will recognize that the present inventions may be beneficially utilized in any number of environments and implementations.

Features and advantages of the disclosure will become more readily understandable from the following detailed description and figures, in which the inventions have been described below with reference to specific embodiments. It will be apparent to those skilled in the art that various modifications may be made and other embodiments can be used without departing from the broader scope of the inventions. Therefore, these and other variations upon the specific embodiments are intended to be covered by the present inventions.

In accordance with the present invention, a tri-state quantizer is used to replace the conventional dual-state quantizer in delta modulation codec. The digital output of the delta modulation codec using a tri-state quantizer of the present invention may be represented by radix-3 digits, instead of by binary bits as in the conventional dual-state digital output. The tri-state quantizer creates an additional holding state to characterize a no-change status where the signal amplitude largely remains the same. The existence of the additional holding state eases the transition between the upper and the lower states, and thus makes significant improvements, particularly on granular noise reduction during signal reconstruction in decoding process. In contrast, in the conventional dual-state delta modulation, a no-change condition is generally either uncharacterized or mischaracterized because in conventional dual-state coding modulated signal can only represent either an increase or decrease.

A coincidence logic, a step size controller, and a look ahead processor may also be implemented in adaptive delta modulation codec to further improve the performance of the tri-state delta modulation technique in accordance with the present invention.

A detailed description of the present invention with references to drawings and specific embodiments is provided below.

Figure 1:
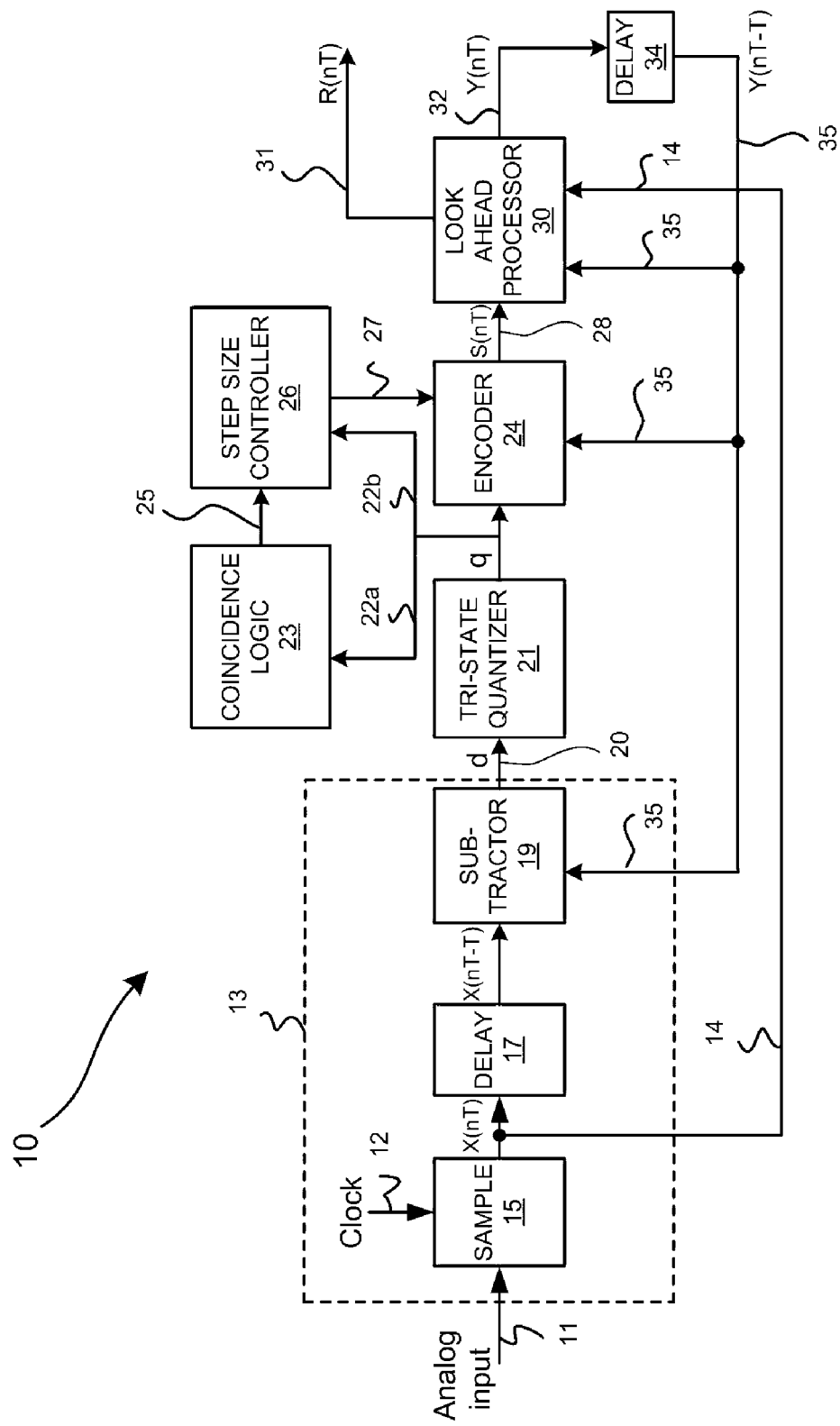
FIG. 1 is a block diagram illustrating a tri-state delta modulation codec system constructed in accordance with an exemplary embodiment of the present invention.

FIG. 1 is a block diagram illustrating a tri-state delta modulation codec system 10 in accordance with an exemplary embodiment of the present invention. Codec system 10 receives an analog input signal at input lead 11, and is responsive to a clock signal applied on lead 12. Codec system 10 has a first block collectively denoted as subtracting unit 13 for computing the difference between a digital signal and a predicted digital signal. Subtracting unit 13 includes sampling unit 15, delay element 17, and subtractor 19. Sampling unit 15 samples the analog signal on input lead 11 in response to the clock signal on lead 12. The sampling generates a pulse signal X(nT) for each sampling period T, where "n" denotes the "nth" sampling period. This converts the analog input signal into a pulse signal X(nT), which is then fed as an input signal to the next stage of signal processing, in this case delay element 17.

Specifically, pulse signal X(nT) is fed to delay element 17 which is used for delaying pulse signal X(nT) by one sampling period T. In addition, pulse signal X(nT) is also sent through lead to 14 to look ahead processor 30 which is discussed in a later section of this description. After passing delaying element 17, delayed pulse signal X(nT−T) is fed to subtractor 19 which computes a deviation value defined as the difference between input signal X(nT−T) and predicted signal Y(nT−T) fed on lead 35 (discussed further in a later section) according to the following formula:

$$d = X(nT-T) - Y(nT-T) \tag{1}$$

After performing the above differential function for comparison, subtractor 19 outputs the deviation value d, which is then applied to tri-state quantizer 21.

Tri-state quantizer 21 operates with two pre-defined (but dynamically adjustable as shown below) values, Dmin and Dmax. It outputs a first value when the difference signal is above Dmax, a second value when the difference signal is below Dmax but above Dmin, and a third value when the difference signal is below Dmin.

In one embodiment, Dmin and Dmax are −Δ/2 and +Δ/2 respectively, where Δ is the step size generated by step size controller 26. A first value +1, second value 0 and third value −1 are used in this embodiment. Tri-state quantizer 21 and 23 quantized values are described in further detail later with reference to FIGS. 2–3.

Output q from tri-state quantizer 21 is then sent to encoder 24 which builds initial next predicted signal S(nT) using the current predicted signal Y(nT−T) sent back from the feedback line 35, the output q, and step size Δ, according to the following exemplary formula:

$$S(nT) = Y(nT-T) + q\Delta \tag{2}$$

In the present description, the terms "current" and "next" are used in their relative sense within the framework of sampling periods. For example, when the sampling period (n−1)T, or (nT−T), is referred to as the "current" sampling period, the sampling period nT would be referred to as the "next" sampling period. But if the sampling period nT is referred to as the "current" sampling period, the sampling period (n−1)T would be referred to as the "last" sampling period. In order to avoid confusion, however, the sampling period (n−1)T is usually referred to as the "current" sampling period in the present description. Correspondingly, S(nT) is referred to as the initial next predicted signal, meaning it's the initial predicted signal for the next sampling period, and so on.

In some simpler embodiments, look ahead processor 30 may be skipped, and the initial next predicted signal S(nT) may be accepted as the final next predicted signal Y(nT). At the same time, S(nT) is used for constructing an output signal such as a radix-3 bitstream R(nT).

In the embodiment shown in FIG. 1, the final next predicted signal Y(nT) passes through delay element 34 and because the current predicted signal Y(nT−T), which is then fed back to encoder 24 and subtractor 19. The basic cycle of the tri-state delta modulation system is thus complete.

Figure 2:
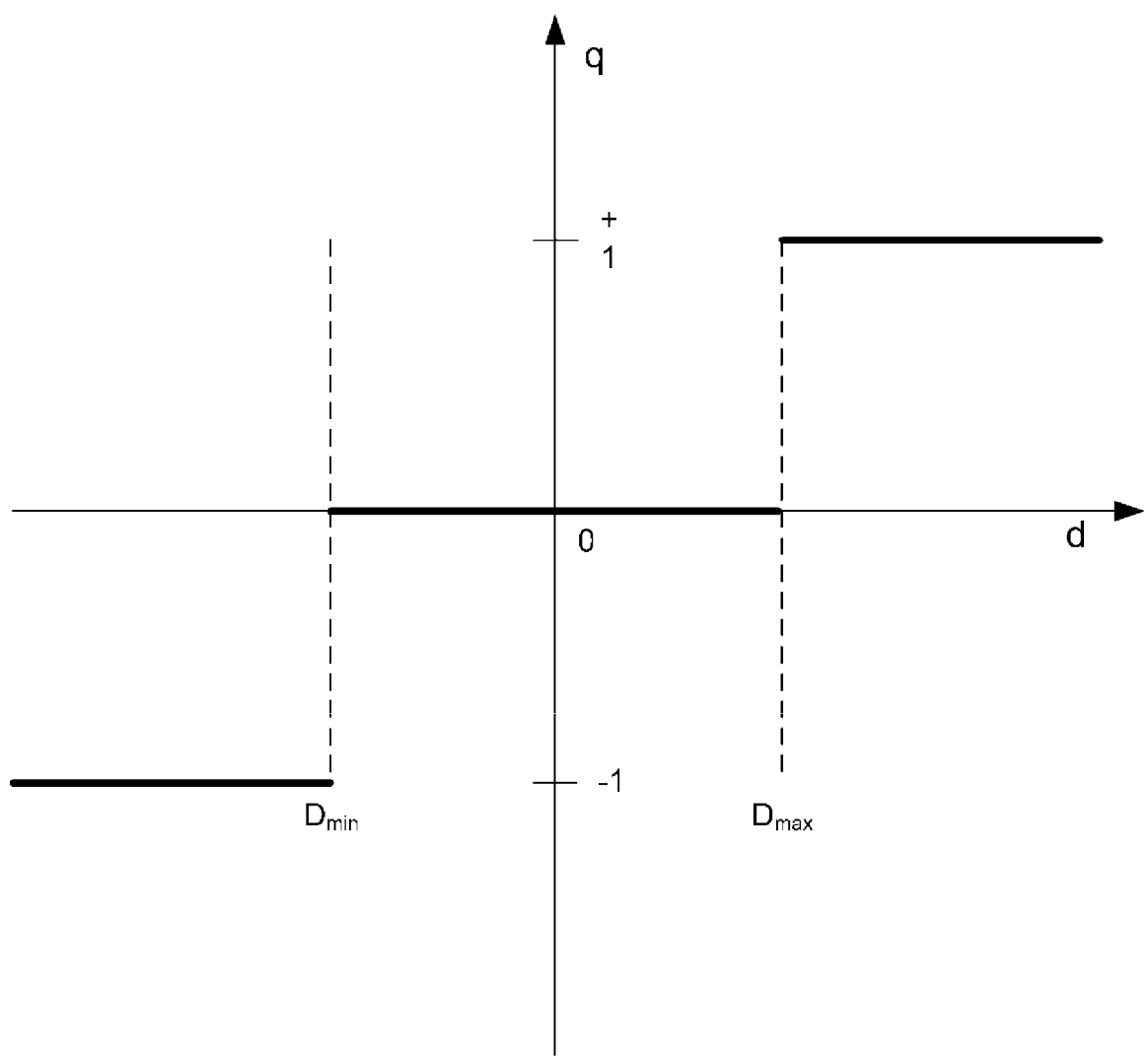
FIG. 2 is a graph illustrating the operational principle of a tri-state quantizer in accordance with an exemplary embodiment of the present invention.

FIG. 2 is a graph illustrating the operational principle of tri-state quantizer 21 in accordance with an exemplary embodiment of the present invention. Output q from tri-state quantizer 21 is defined as follows:

$$q = \begin{cases} +1, & \text{if } d > D\max, \\ 0, & \text{if } D\min \leq d \leq D\max, \\ -1, & \text{if } d < D\min. \end{cases} \quad (3)$$

Figure 3:
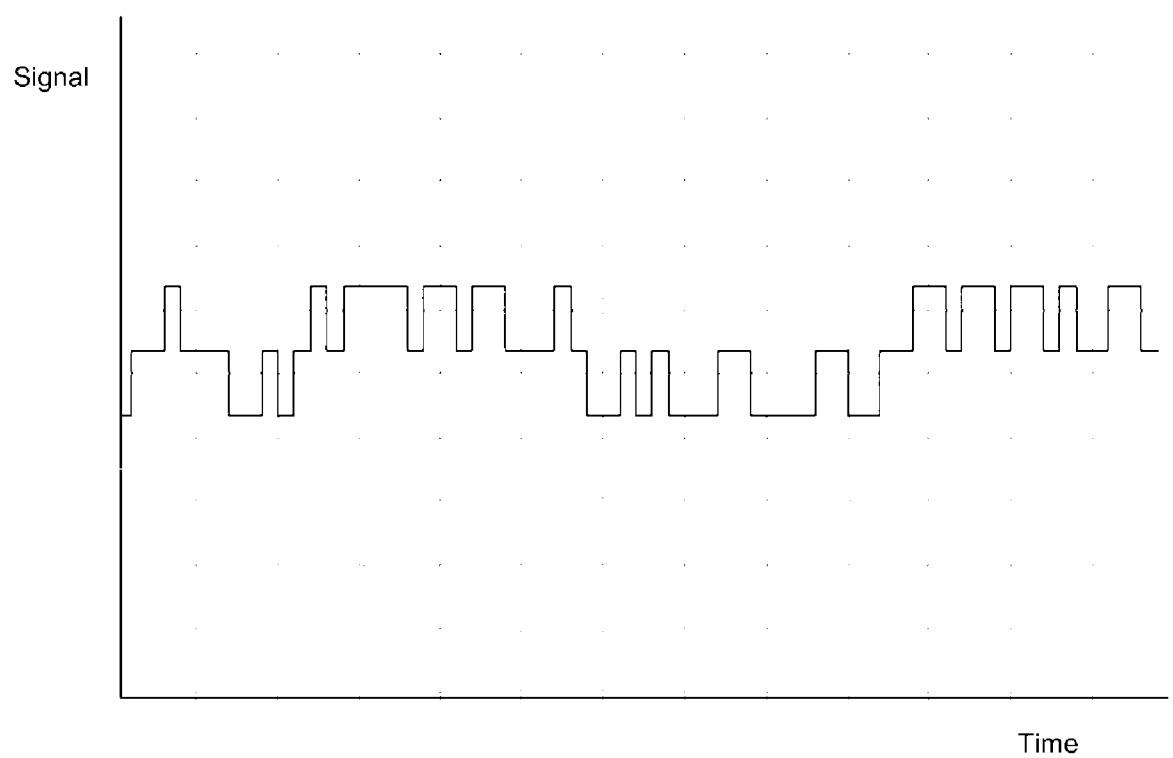
FIG. 3 is a graph illustrating an example of output bitstream generated by delta modulation using a tri-state quantizer in accordance with an exemplary embodiment of the present invention.

FIG. 3 is a graph illustrating an example of output bitstream generated by delta modulation using tri-state quantizer 21 in accordance with an exemplary embodiment of the present invention.

It can be seen in FIGS. 2–3 that tri-state quantizer 21 results in an output bitstream that is distinctive from the conventional dual-state output bitstream. Most significantly, the output bitstream now has a middle state as a transition state or a holding state to significantly reduce transitions between the upper state and the lower state.

The tri-state delta modulation system as described above can be further improved by adding coincidence logic 23 and step size controller 26 which dynamically adjust step size Δ. The adjusted step size Δ is used in the above equation (2) for calculating the initial next predicted signal S(nT), and subsequently the final next predicted signal Y(nT) as described below. Coincidence logic 23 and step size controller 26 are described in further detail with references to FIGS. 4–5.

The tri-state delta modulation system as described above can be further improved by adding look ahead processor 30 which provides the system an additional selection step to determine the final next predicted signal Y(nT) instead of always accepting the initial next predicted signal S(nT) as the final next predicted signal Y(nT). In one embodiment, look ahead processor 30 performs a signal comparison among the initial next predicted signal S(nT), the current predicted signal Y(nT−T) and the next input signal X(nT). Based on the result of the signal comparison, look ahead processor 30 selects the next predicted signal Y(nT) between the initial next predicted signal S(nT) and the current predicted signal Y(nT−T), according to the result of the signal comparison performed by look ahead processor 30.

The final predicted signal Y(nT) is then input through line 32 to delay element 34 and is used for next encoding process in the next sampling period. Look ahead processor 30 is described in further detail later with reference to FIG. 6. As will be shown in FIG. 6, look ahead processor 30 also generates output radix-3 signal R(nT), which is transmitted or stored thorough line 31. The output radix-3 signal R(nT) may be further processed. For example, R(nT) may be decoded to reconstruct predicted signal Y(nT), which is a representation of the ordinal input signal X(nT). This process is further shown in FIG. 8 later.

Figure 4:
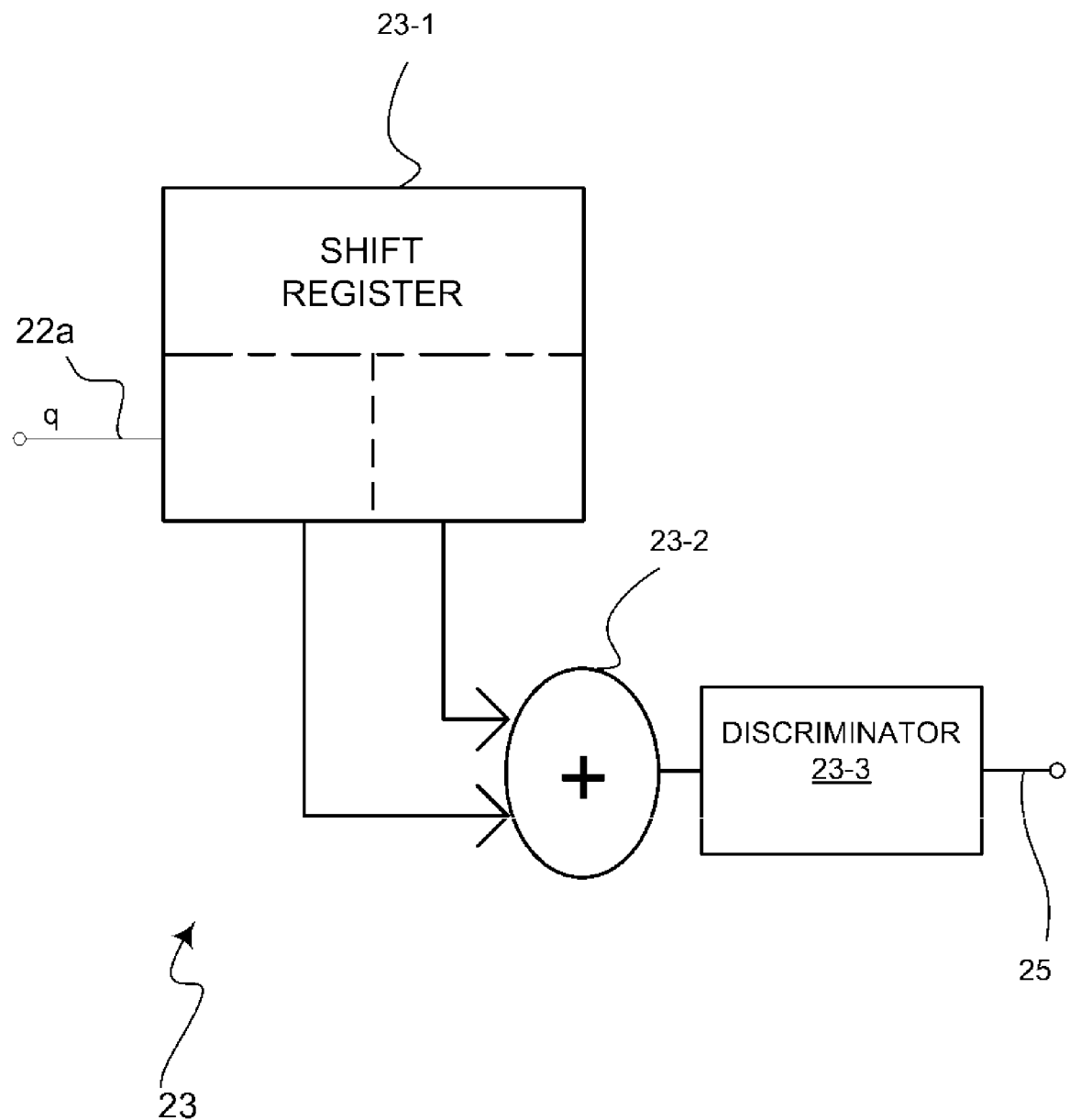
FIG. 4 is a block diagram illustrating a coincidence logic used in an exemplary embodiment of the present invention.

FIG. 4 is a block diagram illustrating a coincidence logic used in an exemplary embodiment of the present invention. As seen in FIGS. 4 and 1, coincidence logic 23 receives at lead 22a output q from tri-state quantizer 21. The received output q is registered at an N-bit shift register 23-1 (where N is a selected positive integer). In one embodiment, the shift register 23-1 is a 1-bit (i.e., N=1) shift register, and in another embodiment a 2-bit (i.e., N=2) shift register. In other embodiments, shift register 23-1 may be a 3-bit (i.e., N=3) shift register, or a shift register having more bits (i.e., N>3). Shift register 23-1 stores a plurality of N values (but a single value when N=1) provided from the output terminal 22 of tri-state quantizer 21. The plurality of N values are summed up at adder 23-2 and input to discriminator 23-3.

"Coincidence" is defined, for the purposes the illustrated embodiment of this invention, as being occurring when the sum of the plurality of N values is N or −N, and non-occurring when the sum of the plurality of N values is neither N nor −N. For example, when a 2-digit shift register is used in coincidence logic 23, "coincidence" occurs when the 2-digit shift register 23-1 of coincidence logic 23 registers either two +1's or two −1's.

It is noted that q value received by shift register 23-1 is a quantized representation of the deviation value d calculated according to differential function d=X(nT−T)−Y(nT−T). For this reason, an occurrence of a coincidence indicates a deviation of the predicted signal Y(nT−T) from the input signal X(nT−T). In other words, the coincidence indicates that the predicted signal Y(nT−T) is not tracking the input signal X(nT−T) well. For example, when shift register 23-1 stores two +1's, it indicates that the predicted signal Y(nT−T) has been smaller than the input signal X(nT−T) for the past two sampling periods. Conversely, when shift register 23-1 stores two −1's, it indicates that the predicted signal Y(nT−T) has been greater than the input signal X(nT−T) for the past two sampling periods.

Shift register 23-1 in coincidence logic 23 thus provides a quantization history which forms the basis for dynamic adaptive adjustment of step size Δ. To do this, coincidence logic 23 outputs a coincidence value "one" when a coincidence occurs, and a value "zero" when coincidence does not occur. The coincidence value is output through discriminator 23-3 to terminal 25 which leads to step size controller 26, which dynamically adjusting step size Δ. As shown above, the quantization history may include just the present quantized value in a simple implementation, but may further include one or more past quantized values of previous sampling periods.

Figure 5:
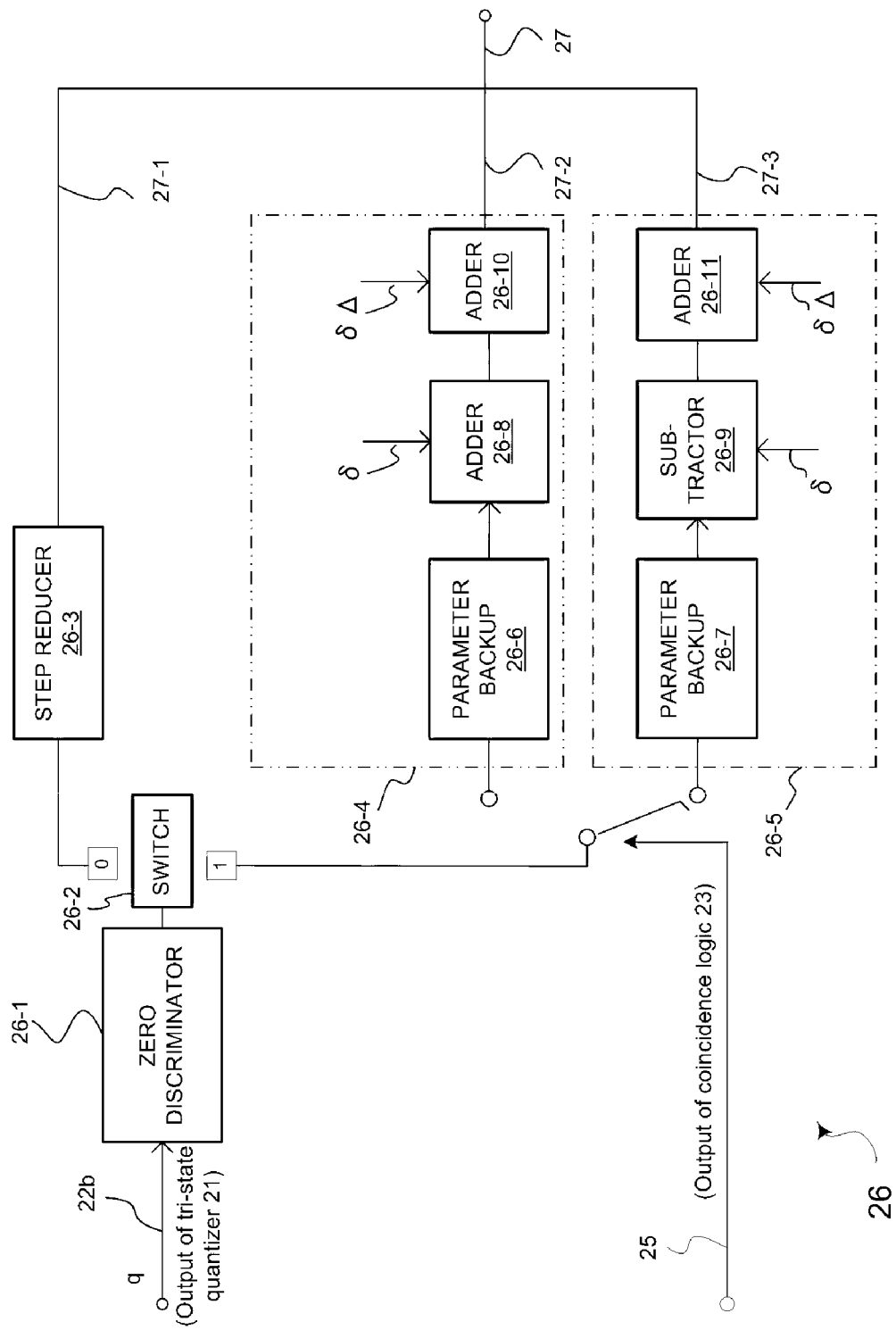
FIG. 5 is a block diagram illustrating the operational principle of a step size controller used in an exemplary embodiment of the present invention.

FIG. 5 is a block diagram illustrating the operational principle of step size controller 26 used in an exemplary embodiment of the present invention. As seen in FIG. 5, output q of current sampling period from tri-state quantizer 21 is applied through line 22b to zero-discriminator 26-1 in step size controller 26. Switch 26-2 selects the next signal processing path according to the output of zero-discriminator 26-1 as described below.

If a zero value of output q is present, step reducer 26-3 is selected through switch 26-2. Through step reducer 26-3, step size Δ is decreased by half, and delta step size δΔ is decreased by δ as follows:

Δ←Δ/2 (i.e., step size Δ is replaced by reduced step size Δ/2); and

δΔ←δΔ−δ (i.e., delta step size δΔ is replaced by reduced delta step size δΔ−δ), where δ>0, and δ may be either constant or dynamically adjustable according to a dynamic range of reconstructed signal Y(nT) in a local time frame. In one particularly embodiment, δ is a constant 3/128 (δ=3/128), and step size Δ and delta step size δΔ are lower bounded by 1/256 and 1/128 respectively.

In case of non-zero value q, switch 26-2 selects a different path which is governed by coincidence signal output from coincidence logic 23 and input from terminal 25. If coincidence logic "one" is input from terminal 25, controlling block 26-4 is selected to increase the encoding step size Δ. Conversely, if coincidence logic "zero" is input, controlling block 26-5 is activated to increase the encoding step size $\Delta$. This modification process is described in further detail below.

Before modification, the current predicted signal Y(nT−T), step size $\Delta$ and delta step size $\delta\Delta$ are backed up by parameter backup 26-6 or parameter backup 26-7, depending on which controlling block (26-4 or 26-5) is selected.

In case of coincidence logic "one", controlling block 26-4 is selected and delta step size $\delta\Delta$ is increased by $\delta$ in adder 26-8:

$\delta\Delta \leftarrow \delta\Delta + \delta$ (i.e., delta step size $\delta\Delta$ is replaced by the increased delta step size $\delta\Delta + \delta$), where $\delta > 0$, and $\delta$ may be either constant or dynamically adjustable according to a dynamic range of reconstructed signal Y(nT) in a local time frame. In one particularly embodiment, $\delta$ is a constant 3/128 ($\delta$=3/128), and delta step size $\delta\Delta$ is upper bounded by 24/256.

Step size $\Delta$ is increased by the new delta step size $\delta\Delta$, whose value is now $\delta\Delta + \delta$, in adder 26-10 and output at lead 27-2:

$\Delta \leftarrow \beta\Delta + (\delta\Delta + \delta)$; or equivalently expressed as:

$\Delta(nT) = \beta\Delta(nT-T) + \delta\Delta(nT)$, where $\delta\Delta(nT) = (\delta\Delta(nT-T) + \delta(nT))$, and $\beta$ is a parameter generally not greater than one, e.g. $0.1 < \beta \leq 1.0$, preferably $0.8 < \beta < 1.0$, and in one embodiment $\beta$ is about 0.9 in value. In one embodiment, step size $\Delta$ is upper bounded by 200/256. In a special case where $\beta$ is equal to 1.0, for instance, the adjustment of step size $\Delta$ is according to the following:

$\Delta(nT) = \Delta(nT-T) + \delta\Delta(nT)$.

In case of coincidence logic "zero", controlling block 26-5 is selected and delta step $\delta\Delta$ is decreased by $\delta$ in subtractor 26-9.

$\delta\Delta \leftarrow \delta\Delta - \delta$.

Step size $\Delta$ is increased by the new delta step $\delta\Delta$, whose value is now $\delta\Delta - \delta$, in adder 26-11 and output at lead 27-3:

$\Delta \leftarrow \beta\Delta + (\delta\Delta - \delta)$, or equivalently expressed as:

$\Delta(nT) = \beta\Delta(nT-T) + \delta\Delta(nT)$, where $\delta\Delta(nT) = (\delta\Delta(nT-T) - \delta(nT))$, $\beta$ is a parameter generally no greater than one, e.g. $0.1 < \beta \leq 1.0$, preferably $0.8 < \beta < 1.0$, and in one embodiment $\beta$ is about 0.9 in value. In a special case where $\beta$ is equal to 1.0, for instance, the adjustment of step size $\Delta$ is according to the following:

$\Delta(nT) = \Delta(nT-T) + \delta\Delta(nT)$.

It is noted that both the specific parsing of the signal paths in step size controller 26 and the quantitative operations of step reducer 26-3, adders 26-8, 26-10, 26-11, and subtractor 26-9 illustrated above are only exemplary. The main idea in this step is to use output q of tri-state quantizer 21 and the output of coincidence logic 23 to dynamically adjust step size $\Delta$ and delta step $\delta\Delta$. It is appreciated that many different schemes may be used for such dynamic adjustment. In particular, the specific changes in step size $\Delta$ and delta step $\delta\Delta$ described above are only for the purpose of illustration. Various formulas for such changes may be used according to the design preference and requirements.

Modified step size $\Delta(nT)$ is output from one of leads 27-1, 27-2 or 27-3 to terminal 27, depending on the switch positions. Terminal 27 leads to encoder 24 in FIG. 1.

Referring back to FIG. 1, modified step size $\Delta$ and current predicted signal Y(nT−T) are input to encoder 24 to build an initial next predicted signal S(nT) according to the following question:

$$S(nT) = Y(nT-T) + q\Delta(nT) \quad (2)$$

The next input signal X(nT) for the next sampling period n, the current predicted signal Y(nT−T), and initial next predicted signal S(nT) are input to look ahead processor 30. The operational principle of look ahead processor 30 is described in FIG. 6 below.

Figure 6:
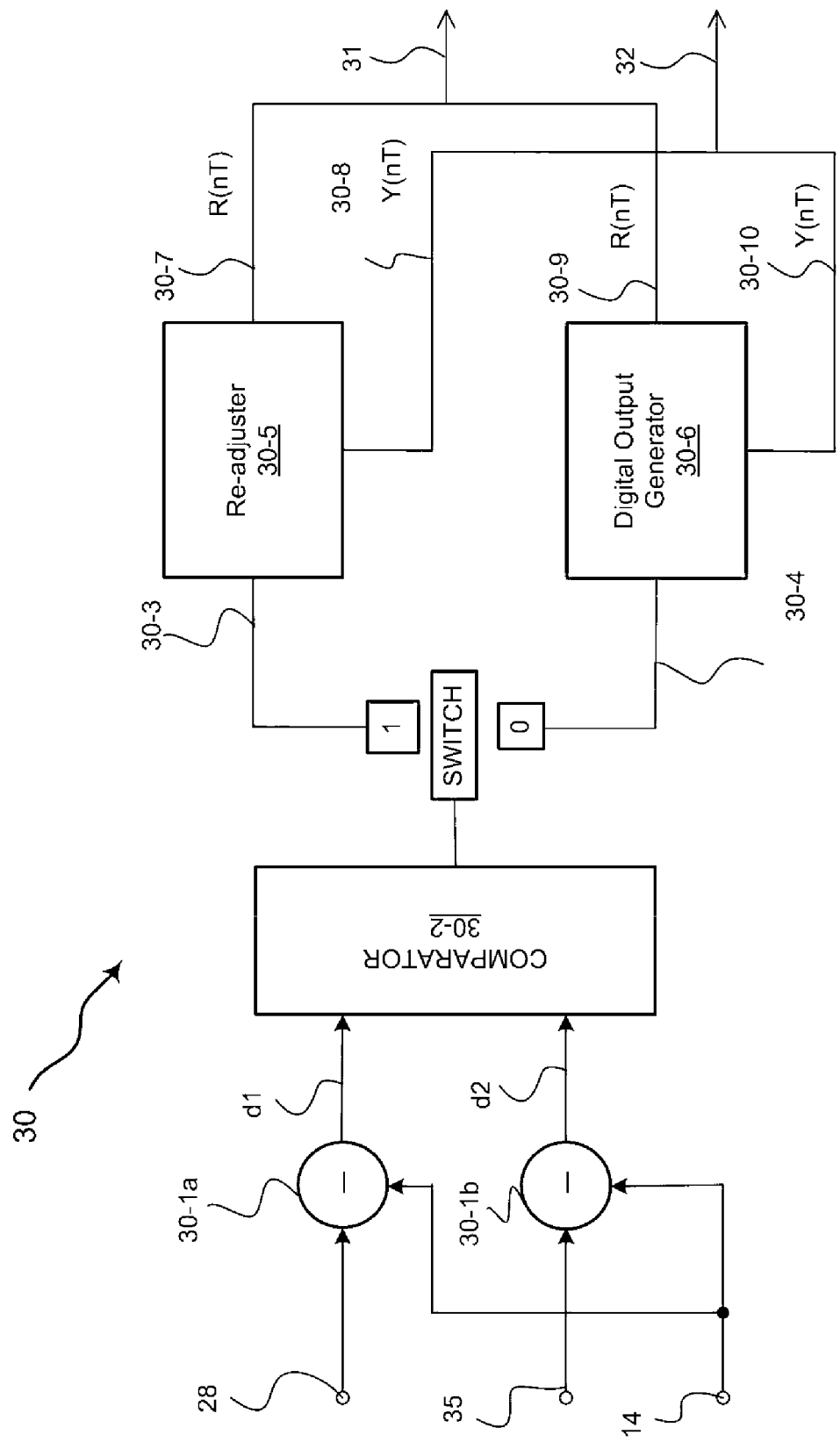
FIG. 6 is a block diagram illustrating a look ahead processor in accordance with an exemplary embodiment of the present invention.

FIG. 6 is a block diagram illustrating look ahead processor 30 in accordance with an exemplary embodiment of the present invention. Look ahead processor 30 receives three different signals, the initial next predicted signal S(nT) at line 28 from encoder 24, the current predicted signal Y(nT−T) at line 35 from delay unit 34, and the next input signal X(nT) at line 14 from sampling unit 15. These signals are fed to subtractors 30-1a and 30-1b, by which two difference values are computed:

$$d1 = S(nT) - X(nT) \quad (4)$$

$$d2 = Y(nT-T) - X(nT) \quad (5)$$

The two difference values d1 and d2 are input into comparator 30-2 which compares and evaluates the two difference values d1 and d2 in order to select the final next predicted signal Y(nT).

If $|d1| < |d2|$, comparator 30-2 outputs a value "0". Path 30-4 is accordingly selected. A smaller difference value d1 than d2 indicates that the initial next predicted signal S(nT) is a closer match to the next input signal X(nT) than the current predicted signal Y(nT−T), and therefore should be adopted. In this case, the initial next predicted signal S(nT) determined according to equation (3) is treated as the final result for the next predicted signal:

$$Y(nT) = S(nT) \quad (6)$$

The final next predicted signal Y(nT) is output through line 30-10 to line 32 (FIG. 1). At the same time, the modified step size $\Delta$ and delta step size $q\Delta$ are also treated as the final respective value.

Meanwhile, output q of tri-state quantizer 21 is remapped to a radix-3 value R(nT) according to a mapping function M:

$$R(nT) = M(q) \quad (7)$$

In one embodiment, −1, 0, +1 are mapped to 2, 0, 1, respectively. This radix-3 value R(nT) is output simultaneously through line 30-9 to line 31 (FIG. 1) for storage or transmission. The outputs are handled by digital output generator 30-6.

If $|d1| \geq |d2|$, comparator 30-2 outputs a value "1". Path 30-3 is accordingly selected as the output path. A greater difference value d1 than d2 indicates that the initial next predicted signal S(nT) does not match the next input signal X(nT) as close as the current predicted signal Y(nT−T) would, and therefore should not be adopted. In this case, the initial next predicted signal S(nT), modified step size $\Delta$ and modified delta step size $q\Delta$ are skipped. The corresponding old values are restored and recalculated by re-adjuster 30-5 as follows:

$$Y(nT) = Y(nT-T) \quad (8)$$

$\Delta \leftarrow \Delta/2$ $\delta\Delta \leftarrow \delta\Delta - \delta$, where Y(nT−T), Δ/2, and δΔ−δ at right hand side are the old predicted signal, step size and delta step size, respectively. These values are restored as the corresponding current values.

Digital output R(nT) is reset as:

$$R(nT) = M(0), \quad (9)$$

where M is the mapping function.

Y(nT) is output to line 32 (FIG. 1) through line 30-8, while R(nT) is output to line 31 through line 30-7 for storage or transmission. A further explanation for the occurrence of |d1|≧|d2| is shown in FIG. 7.

Figure 7:
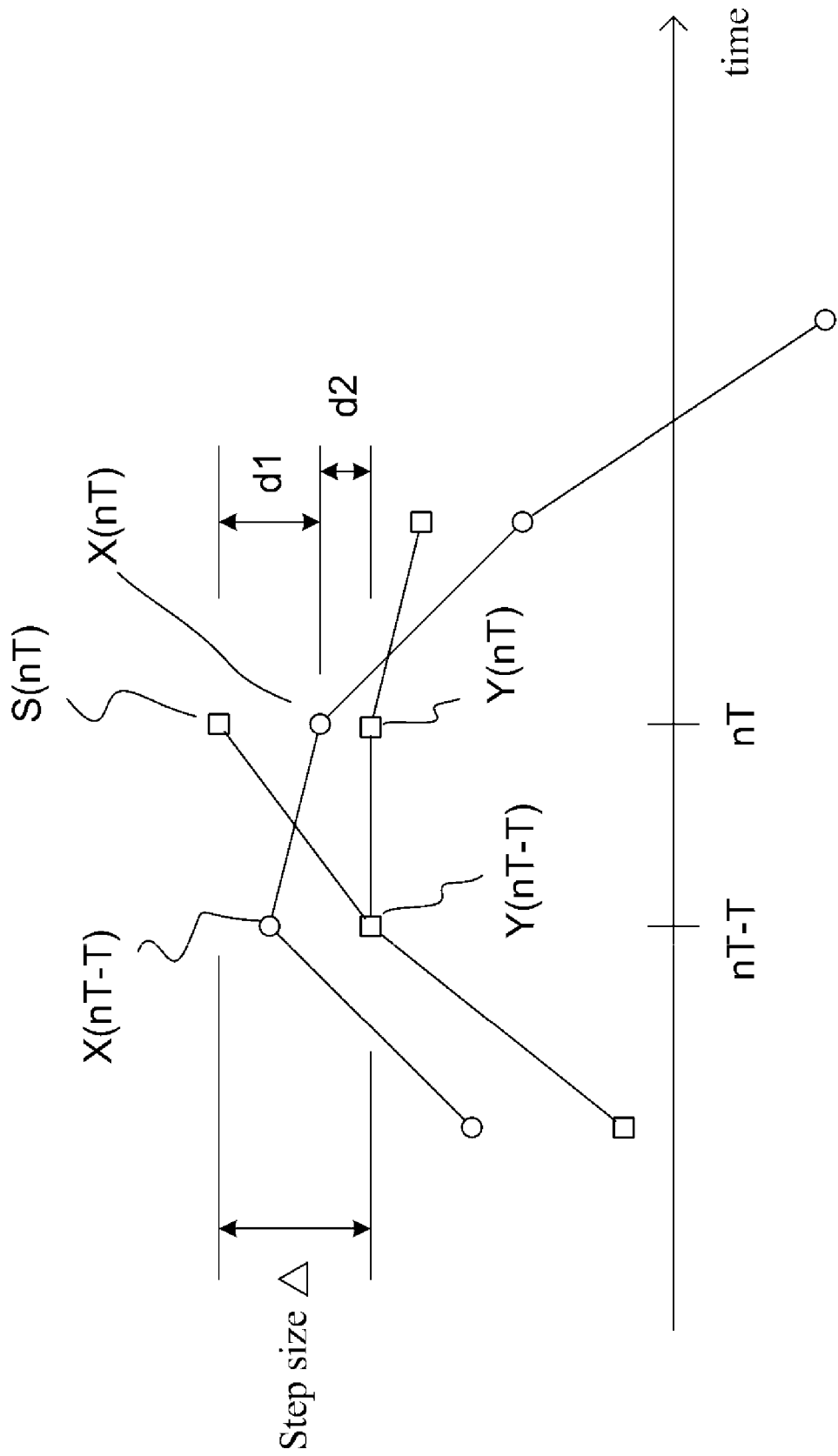
FIG. 7 is a waveform diagram explanatory of the look ahead mechanism in accordance with an exemplary embodiment of the present invention

FIG. 7 is a waveform diagram explanatory of the look ahead mechanism in accordance with an exemplary embodiment of the present invention. As shown in FIG. 7, when |d1|≧|d2|, the initial next predicted signal S(nT) would not match the next input signal X(nT) as close as the current predicted signal Y(nT−T) does. As a result, the newly proposed predicted signal S(nT) is skipped and the current predicted signal Y(nT−T) is used as the final next predicted signal Y(nT).

As shown in FIG. 1, the final next predicted signal Y(nT) is input through line 32 to delay element 34 and is used for next encoding process in the next sampling period. Output radix-3 signal R(nT) is sent through either line 30-7 or line 30-9 (FIG. 6) to line 31 (FIG. 1) to be transmitted or stored. The output radix-3 signal R(nT) may be further processed. For example, R(nT) may be decoded to reconstruct predicted signal Y(nT) as a representation of the ordinal input signal X(nT). This process is further illustrated in FIG. 8.

Figure 8:
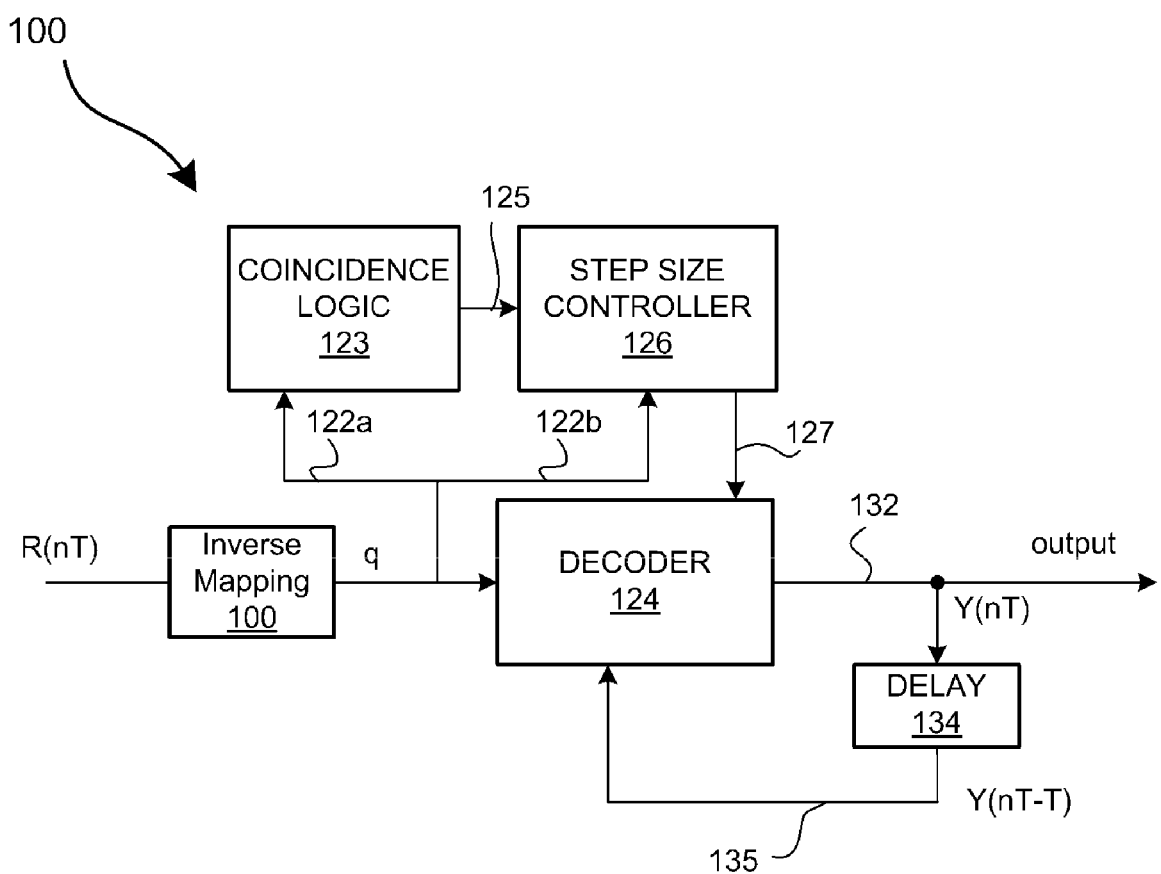
FIG. 8 is a block diagram illustrating a decoding process in accordance with an exemplary embodiment of the present invention.

FIG. 8 is a block diagram illustrating a decoding process in accordance with an exemplary embodiment of the present invention. As shown in FIG. 8, radix-3 bit-stream R(nT) is input and remapped to q:

$$q = M^{-1}(R(nT)), \quad (10)$$

where $M^{-1}$ is the inverse mapping function.

Value q is in turn input to coincidence logic 123 and step size controller 126, which have an internal structure that are identical to coincidence logic 23 and step size controller 26 short in FIG. 1, respectively. Y(nT) is reconstructed by decoder 124:

$$Y(nT) = Y(nT-T) + q\Delta(nT) \quad (11)$$

The present invention thus provides a tri-state encoder for processing signals. In one embodiment of this invention, an input analog signal is encoded to a radix-3 output bitstream, in which each "bit" is a "radix-3 digit", having three possible values. The tri-state encoder introduces an extra middle state which functions as either a holding state or transition state, significantly improving the performance over the conventional to dual-state encoders. For example, granular noise created by conventional adaptive delta modulation is greatly attenuated even at low sampling frequency such as bit rate below 16 kbps.

The tri-state coding mechanism of the present inventions also has an advantage of being insensitive to transmission random bit error. The introduction of a middle state (e.g., zero state) results in an output bitstream that spans less frequency spectrum because the middle state acts as a transitional state are holding state when bit pattern changes from +1 to −1, and thus reduces the power of high-frequency component of the frequency spectrum of the bitstream.

Coincidence logic 23, step size controller 26 and look ahead processor 30 described herein further improve the performance of the tri-state delta codec method and system in accordance with the present invention. These components are optional and may be skipped altogether in a system of simple implementation. Alternatively, these components may be present in the system but only used in some sampling periods or sampling cycles but not in all of them. For example, look ahead processor 30 may be used in an alternate manner in which look ahead processor 30 performs a look-ahead function in alternating sampling cycles but not in consecutive multiple sampling cycles. This affords flexibility in designing of the system suited for different applications and requirements.

In one example, the performance of tri-state modulation in accordance with the present invention is compared with that of conventional Continuous Variable Step Delta Modulation (CVSD). The results are shown in FIGS. 9–11.

Figure 9:
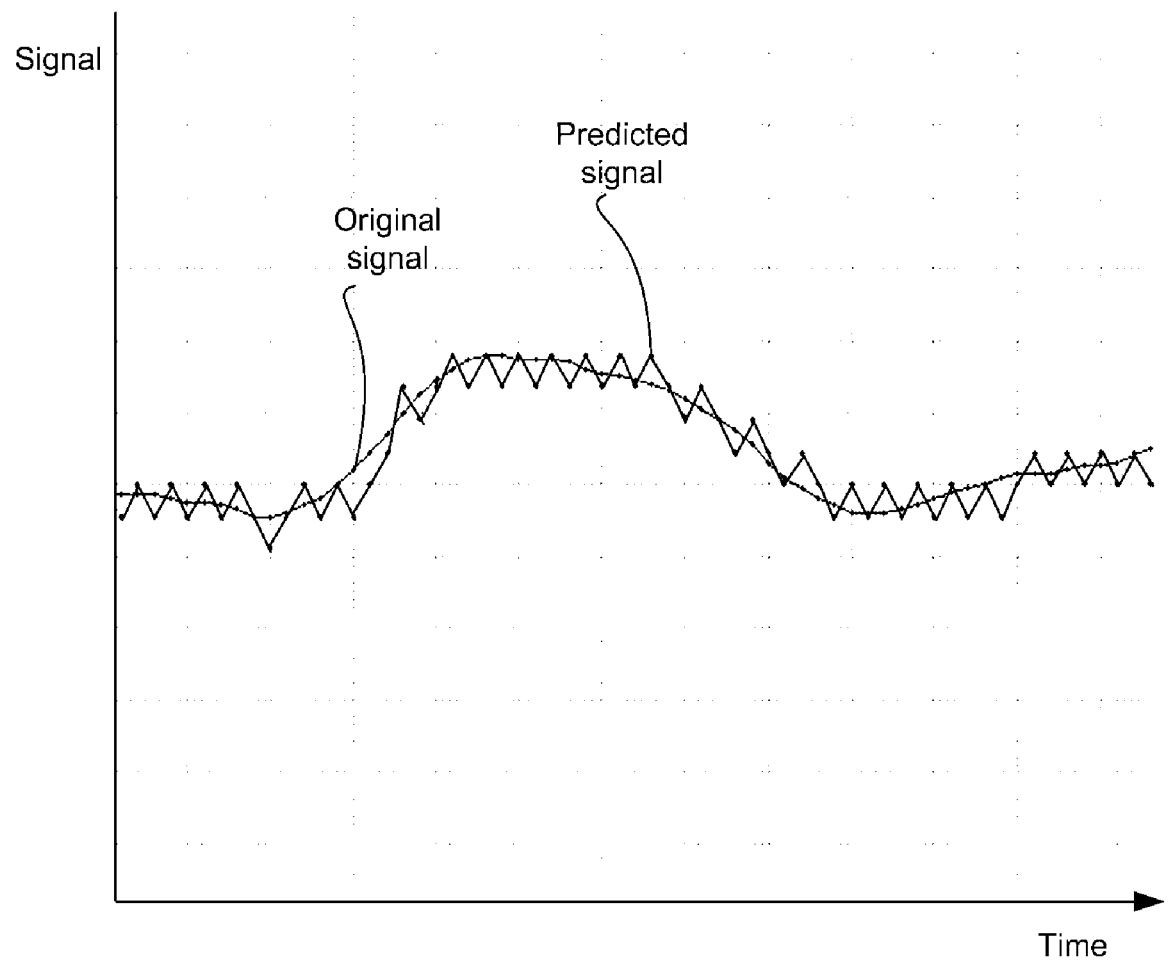
FIG. 9 is a graph showing a performance of a conventional Continuous Variable Step Delta Modulation (CVSD) at a 16 kbps data rate.

FIG. 9 is a graph showing a performance of a conventional Continuous Variable Step Delta Modulation (CVSD) at a 16 kbps data rate.

Figure 10:
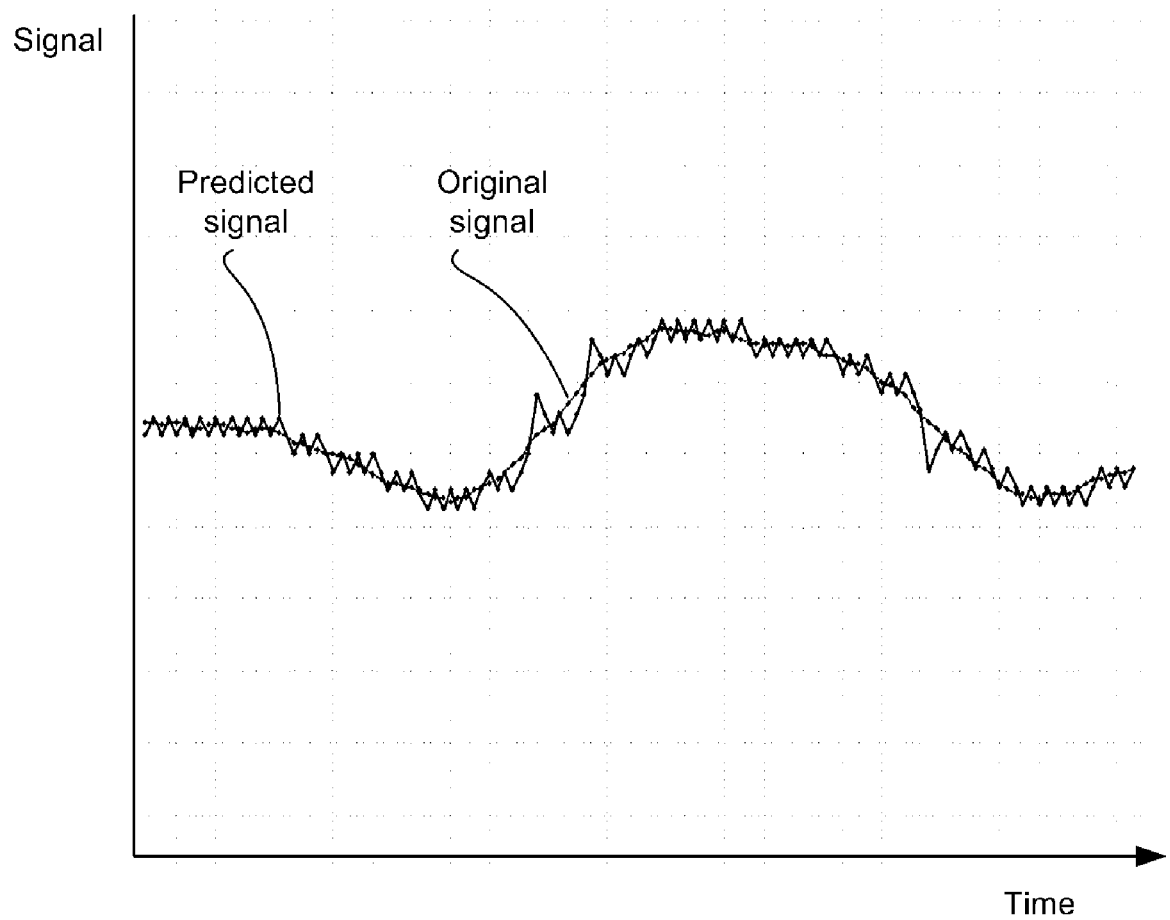
FIG. 10 is a graph showing a performance of a conventional Continuous Variable Step Delta Modulation (CVSD) at a 32 kbps data rate.

FIG. 10 is a graph showing a performance of a conventional Continuous Variable Step Delta Modulation (CVSD) at a 32 kbps data rate.

Figure 11:
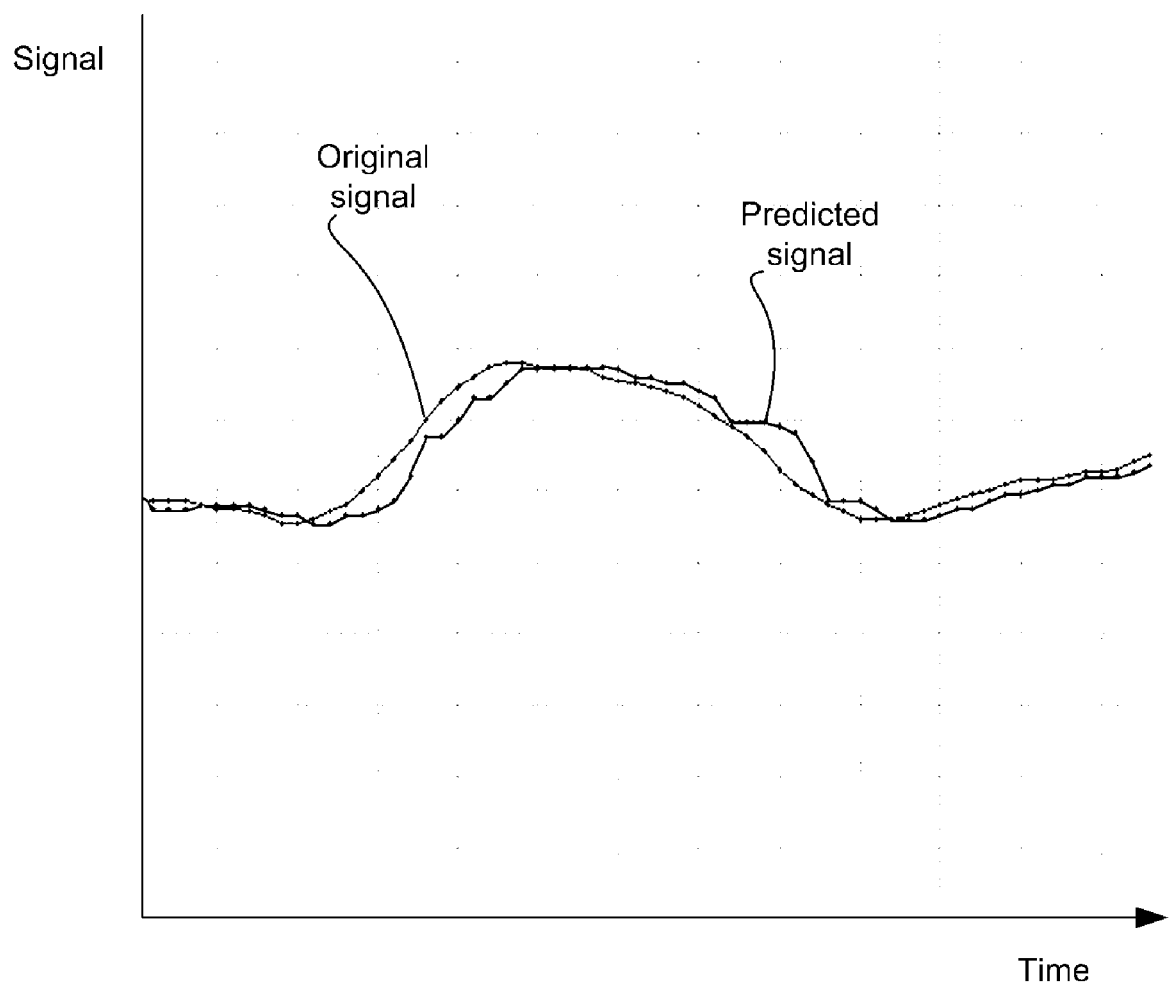
FIG. 11 is a graph showing a performance of a tri-state delta modulation in accordance with an exemplary embodiment of the present invention at a 16 kbps data rate.

FIG. 11 is a graph showing a performance of a tri-state delta modulation in accordance with an exemplary embodiment of the present invention at a 16 kbps data rate.

For the above results shown in FIGS. 9 and 11, the input signal is an audio signal with 8 kHz sampling frequency ($f_s$). The input signal is oversampled by a factor of two such that the sampled signal is in the form of 16 kHz. Oversampling process is implemented by linear interpolation with additional sampling inserted in between every two samples. The oversampled signal with $f_s$=16 kHz is then input into the experimented encoders. The encoder for the results in a FIG. 9 is a conventional CVSD encoder, while the encoder for the results in a FIG. 11 has a tri-state quantizer and a look ahead processor according to the present invention. For the above results shown in FIG. 10, an oversampling signal with $f_s$=32 kHz is used in a conventional CVSD encoder.

As shown in the above results in FIGS. 9–11, the tri-state modulation at 16 kbps data rate produced a predicted signal (shown in FIG. 11) with granular noise level much lower than the conventional CVSD at 16 kbps (FIG. 9), and comparable to the conventional CVSD at a 32 kbps (FIG. 10).

The tri-state modulation method and system according to the present invention may be advantageously used in a broad range of applications, including but not limited to real-time voice recording, digital telephone answering device (DTAD), wireless signal transmission such as wireless phones, walkie-talkie and radios. The method and the system are particularly suitable for narrowband voice or audio applications, but are not limited to such applications in principle. The method and the system may be used for processing any type of digital signals, including image signals and data signals that may benefit from lowering sampling frequency without suffering loss of quality.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method of quantizing a signal in a digital signal processing system, comprising the steps of:
   receiving an input signal;
   comparing the input signal and a current predicted signal using a comparison unit, the comparison unit comprising a subtractor for computing a deviation value by subtracting between the current predicted signal and the input signal;
   quantizing the input signal using a tri-state quantizer into a current quantized value selected from a set of three different quantized values including a low value, a middle value, and a high value, the selection of the value being based on a result of comparing the input signal and the current predicted signal such that the current quantized value is selected to be:
   a. the low value of the three different quantized values when the deviation value is below a minimum threshold;
   b. the middle value of the three different quantized values when the deviation value is greater or equal to the minimum threshold but smaller or equal to a maximum threshold; or
   c. the high value of the three different quantized values when the deviation value is greater than the maximum threshold;
   generating from the current quantized value an output signal representative of the input signal;
   determining a next predicted signal for a subsequent sampling period;
   feeding the next predicted signal back to the comparison unit; and
   dynamically adjusting a quantization step size using a step-size controller, the adjusting being at least partially based on a quantization history including a quantized value of at least one sampling period, the quantization step size being defined by a difference between the maximum threshold and the minimum threshold.

2. The method according to claim 1, wherein the low value of the current quantized value corresponds to a decrease of an amplitude of the output signal, the middle value of the current quantized value corresponds to a non-change of the amplitude of the output signal, and the high value of the current quantized value corresponds to an increase of the amplitude of the output signal.

3. The method according to claim 1, wherein the quantization history includes the current quantized value and a past quantized value of a previous sampling period.

4. The method according to claim 1, wherein the quantization step size is adjusted by an amount measured by a delta step, and wherein the delta step is further dynamically adjusted using the step-size controller, the adjusting being at least partially based on the quantization history.

5. The method according to claim 1, further comprises:
   building an initial next predicted signal for the subsequent sampling period using the current predicted signal, the current quantized value and a current step size;
   performing a signal comparison among the initial next predicted signal, the current predicted signal and a next input signal for the subsequent sampling period; and
   selecting the next predicted signal between the initial next predicted signal and the current predicted signal according to a result of the signal comparison.

6. The method according to claim 5, wherein the step of performing a signal comparison comprises:
   comparing the initial next predicted signal with the next input signal to generate a first deviation value; and
   comparing the current predicted signal with the next input signal to generate a second deviation value,
   wherein the first deviation value being computed from a subtraction between the initial next predicted signal and the next input signal from, the second deviation value being computed from a subtraction between the current predicted signal and the next input signal, and wherein the next predicted signal is selected to be the initial next predicted signal if the first deviation value is smaller than the second deviation value, whereas the next predicted signal is selected to be the current predicted signal if the first deviation value is greater than or equal to the second deviation value.

7. The method according to claim 1, further comprising mapping the current quantized value into a mapped value using a mapping function.

8. The method according to claim 7, wherein the mapped value is a radix-3 value.

9. The method according to claim 1, further comprising:
   receiving an analog signal;
   sampling the received analog signal using a clock signal to generate a pulse signal having a clock frequency; and
   feeding the pulse signal as the input signal for quantization.

10. The method according to claim 1, further comprising delaying the input signal by a sampling period using a first delay unit before the input signal is quantized, and the step of feeding the next predicted signal back to the comparison unit comprises:
    delaying the next predicted signal by a sampling period using a second delay unit; and
    feeding a delayed predicted signal output from the second delay unit to the comparison unit.

11. In delta modulation method adapted to receive an input signal to be encoded and produce in response thereto an encoded output signal representative of the input signal received, the delta modulation including deriving a deviation value based on a comparison between the input signal and a predicted signal of a corresponding sampling period, and quantizing the input signal using delta quantization according to the deviation value; wherein the improvement comprises:
    quantizing the input signal using a tri-state quantizer into a quantized value selected from a set of three different quantized values including a low value, a middle value, and a high value, the selection of the quantized value being based on the comparison between the input signal and the predicted signal; and
    dynamically adjusting a quantization step size using a step-size controller, the adjusting being at least partially based on a quantization history including the quantized value of at least one sampling period, the quantization step size being defined by a difference between a maximum threshold and a minimum threshold.

12. The improved delta modulation method according to claim 11, wherein the deviation value is computed by a subtractor subtracting between the predicted signal and the input signal, and wherein the quantized value is selected to be:
    a. the low value when the deviation value is below a minimum threshold;
    b. the middle value when the deviation value is greater or equal to the minimum threshold but smaller or equal to a maximum threshold; or
    c. the high value when the deviation value is greater than the maximum threshold.

13. A data codec system for digital communication, comprising:
- a signal input stage adapted for receiving an input signal;
- a signal comparison stage adapted for comparing the input signal and a current predicted signal;
- a tri-state quantizer adapted for quantizing the input signal using a tri-state quantizer into a quantized value selected from a set of three different quantized values including a low value, a middle value, and a high value, the selection of the quantized value being based on a result from the signal comparison stage;
- an encoding stage for generating from the quantized value an output signal representative of the input signal and determining a next predicted signal of a next sampling period;
- a feedback stage for feeding the next predicted signal back to the tri-state quantizer, and
- a look ahead processor adapted for assisting the encoding stage to determine the next predicted signal.

14. The delta codec system according to claim 13 wherein the signal comparison stage comprises a subtractor computing a deviation value by subtracting between the predicted signal and the input signal.

15. The delta codec system according to claim 13, further comprising:
- a step-size controller adapted for dynamically adjusting a quantization step size, the adjusting being at least partially based on a quantization history including the quantized value of at least one sampling period, the quantization step size being defined by a difference between a maximum threshold and a minimum threshold.

16. The delta codec system according to claim 15, further comprising:
- a logic circuit for determining coincidence based on the quantization history.

17. A method of quantizing a signal in a digital signal processing system, comprising the steps of:
- receiving an input signal;
- comparing the input signal and a current predicted signal using a comparison unit;
- quantizing the input signal using a tri-state quantizer into a current quantized value selected from a set of three different quantized values including a low value, a middle value, and a high value, the selection of the value being based on a result of comparing the input signal and the current predicted signal;
- generating from the current quantized value an output signal representative of the input signal;
- determining a next predicted signal for a subsequent sampling period;
- feeding the next predicted signal back to the comparison unit;
- building an initial next predicted signal for the subsequent sampling period using the current predicted signal, the current quantized value and a current step size;
- performing a signal comparison among the initial next predicted signal, the current predicted signal and a next input signal for the subsequent sampling period; and
- selecting the next predicted signal between the initial next predicted signal and the current predicted signal according to a result of the signal comparison.

18. A method of quantizing a signal in a digital signal processing system, comprising the steps of:
- receiving an input signal;
- comparing the input signal and a current predicted signal using a comparison unit;
- quantizing the input signal using a tri-state quantizer into a current quantized value selected from a set of three different quantized values including a low value, a middle value, and a high value, the selection of the value being based on a result of comparing the input signal and the current predicted signal;
- generating from the current quantized value an output signal representative of the input signal;
- determining a next predicted signal for a subsequent sampling period;
- delaying the input signal by a sampling period using a first delay unit before the input signal is quantized;
- delaying the next predicted signal by a sampling period using a second delay unit; and
- feeding a delayed predicted signal output from the second delay unit to the comparison unit.

19. A data codec system for digital communication, comprising:
- a signal input stage adapted for receiving an input signal;
- a signal comparison stage adapted for comparing the input signal and a current predicted signal;
- a tri-state quantizer adapted for quantizing the input signal using a tri-state quantizer into a quantized value selected from a set of three different quantized values including a low value, a middle value, and a high value, the selection of the quantized value being based on a result from the signal comparison stage;
- an encoding stage for generating from the quantized value an output signal representative of the input signal and determining a next predicted signal of a next sampling period;
- a feedback stage for feeding the next predicted signal back to the tri-state quantizer; and
- a step-size controller adapted for dynamically adjusting a quantization step size, the adjusting being at least partially based on a quantization history including the quantized value of at least one sampling period, the quantization step size being defined by a difference between a maximum threshold and a minimum threshold.

* * * * *